(12) United States Patent
Feng et al.

(10) Patent No.: US 11,869,802 B2
(45) Date of Patent: Jan. 9, 2024

(54) METHOD OF FORMING SEMICONDUCTOR ISOLATION STRUCTURE AND SEMICONDUCTOR ISOLATION STRUCTURE

(71) Applicant: CHANGXIN MEMORY TECHNOLOGIES, INC., Anhui (CN)

(72) Inventors: Wei Feng, Hefei (CN); Haihan Hung, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 219 days.

(21) Appl. No.: 17/386,501

(22) Filed: Jul. 27, 2021

(65) Prior Publication Data

US 2022/0037195 A1   Feb. 3, 2022

Related U.S. Application Data

(63) Continuation of application No. PCT/CN2021/093894, filed on May 14, 2021.

(30) Foreign Application Priority Data

Jul. 29, 2020 (CN) .......................... 202010745804.X

(51) Int. Cl.
| | | |
|---|---|---|
| *H01L 21/762* | (2006.01) | |
| *H01L 21/02* | (2006.01) | |
| *H01L 21/3115* | (2006.01) | |

(52) U.S. Cl.
CPC .. *H01L 21/76232* (2013.01); *H01L 21/02236* (2013.01); *H01L 21/31155* (2013.01)

(58) Field of Classification Search
CPC ......... H01L 21/76232; H01L 21/02236; H01L 21/31155
(Continued)

(56) References Cited

U.S. PATENT DOCUMENTS 4,666,556 A * 5/1987 Fulton ............... H01L 21/76237
257/652
6,458,647 B1 10/2002 Tews
(Continued)

FOREIGN PATENT DOCUMENTS

| CN | 1877839 A | 12/2006 |
|---|---|---|
| CN | 101136355 A | 3/2008 |

(Continued)

*Primary Examiner* — Quoc D Hoang
(74) *Attorney, Agent, or Firm* — Cooper Legal Group, LLC

(57) ABSTRACT

A method of forming a semiconductor structure and the semiconductor structure are provided. The method includes the following operations. A semiconductor substrate is provided, in which a plurality of isolation grooves distributed at intervals are provided in the semiconductor substrate, and each of the isolation grooves includes a top region isolation groove and a bottom region isolation groove. A first protective layer covering the side wall of the top region isolation groove and the top of the semiconductor substrate is formed. Oxidation treatment is performed on the bottom region isolation groove to oxidize a part of the semiconductor substrate close to the bottom region isolation groove to form a second substrate isolation layer. A dielectric layer filling the isolation groove is formed. The first protective layer and the dielectric layer higher than the top of the semiconductor substrate are etched to form an isolation structure.

10 Claims, 12 Drawing Sheets

(58) Field of Classification Search
USPC .......................................... 257/506; 438/452
See application file for complete search history.

(56) References Cited

U.S. PATENT DOCUMENTS

| | | |
|---|---|---|
| 7,501,686 B2 | 3/2009 | Okuno |
| 8,030,171 B2 | 10/2011 | Seto |
| 2006/0281245 A1 | 12/2006 | Okuno |
| 2008/0057669 A1 | 3/2008 | Seto |
| 2008/0293213 A1 | 11/2008 | Yang |
| 2015/0145002 A1* | 5/2015 | Lee .................. H01L 21/02255 257/192 |

FOREIGN PATENT DOCUMENTS

| | | |
|---|---|---|
| CN | 102543822 A | 7/2012 |
| CN | 105448802 A | 3/2016 |
| CN | 209029354 U | 6/2019 |

\* cited by examiner

METHOD OF FORMING SEMICONDUCTOR ISOLATION STRUCTURE AND SEMICONDUCTOR ISOLATION STRUCTURE

CROSS-REFERENCE TO RELATED APPLICATIONS

The present application is a U.S. continuation applications of International Application No. PCT/CN2021/093894, filed on May 14, 2021, which claims priority to Chinese Patent Application No. 202010745804.X, filed on Jul. 29, 2020. International Application No. PCT/CN2021/093894 and Chinese Patent Application No. 202010745804.X are incorporated herein by reference in their entireties.

TECHNICAL FIELD

This application relates to the field of semiconductors, and particularly relates to a method of forming a semiconductor structure and the semiconductor structure.

BACKGROUND

A Dynamic Random Access Memory (DRAM) is a semiconductor memory widely used in computer systems. As the feature size of semiconductor integrated circuit devices continues to reduce, the critical size of the DRAM is getting smaller and smaller, and the manufacture is getting more and more difficult.

With the DRAM process technology coming to around 17 nm, due to the introduction of the polysilicon thin layer compensation technology, an isolation groove is prone to generate a thicker silicon gasket at the bottom of a region with a high depth-to-width ratio during polysilicon deposition. The thicker silicon gasket at the bottom cannot be completely oxidized in the subsequent oxidation process, so that the isolation effect of the formed isolation structure is weakened, resulting in electrical abnormality of a semiconductor device.

SUMMARY

The embodiments of this application provide a method of forming a semiconductor structure and the semiconductor structure. The feature size of the bottom of the isolation groove is enlarged, while the feature size of an active region between isolation grooves will not change, thereby improving the isolation effect of the formed isolation structure.

In order to solve the above technical problems, the embodiments of this application provide a method of forming a semiconductor structure, including: a semiconductor substrate is provided, in which a plurality of isolation grooves distributed at intervals are provided in the semiconductor substrate, each of the isolation grooves includes a top region isolation groove and a bottom region isolation groove, and the top region isolation groove is at a higher position than the bottom region isolation groove; a first protective layer covering the side wall of the top region isolation groove and the top of the semiconductor substrate is formed; oxidation treatment is performed on the bottom region isolation groove to oxidize a part of the semiconductor substrate close to the bottom region isolation groove to form a second substrate isolation layer; and a dielectric layer filling the isolation groove is formed, and the first protective layer and the dielectric layer higher than the top of the semiconductor substrate are etched to form an isolation structure.

Compared with related technologies, the first protective layer is formed on the side wall of the top region isolation groove to prevent the semiconductor substrate between the isolation grooves from being oxidized during the manufacturing process of the isolation groove, thereby preventing the feature size of the active region between the isolation grooves from becoming smaller. Then, the oxidation treatment is performed on the bottom region isolation groove to convert the semiconductor substrate close to the bottom region isolation groove into a second substrate isolation layer. In the process of converting the semiconductor substrate into the second substrate isolation layer, a part of the second substrate isolation layer grows inward, and a part of the second substrate isolation layer grows outward, so that in a direction parallel to the top surface of the semiconductor substrate, the feature size of the bottom of the isolation structure formed by subsequent filling is greater than the feature size of the formed bottom region isolation groove, so as to improve the isolation effect of the formed isolation structure.

In addition, the first protective layer covering the side wall of the top region isolation groove and the top of the semiconductor substrate is formed, including: a first protective film covering the top of the semiconductor substrate and the side wall of the isolation groove is formed; a sacrificial layer filling the bottom region isolation groove is formed; the first protective film on the top of the semiconductor substrate and the side wall of the top region isolation groove is treated to form the first protective layer; and the sacrificial layer and the first protective film which is not subjected to the treating are removed, in which an etching rate of the first protective layer is less than an etching rate of the first protective film.

In addition, the sacrificial layer filling the bottom region isolation groove is formed, including: a sacrificial film filling the isolation groove is formed, wherein the sacrificial film further covers a top surface of the semiconductor substrate; the sacrificial film higher than the surface of the first protective film is removed; and the sacrificial film in the top region isolation groove is removed to form the sacrificial layer.

In addition, the treatment includes ion implantation, and an implanted ion at least includes one of phosphorus, arsenic, boron, boron fluoride or carbon. The ion implantation is performed in a tilted implantation manner, and a tilt angle ranges from 15° to 20°.

In addition, the first protective film includes a single crystal silicon layer, a polysilicon layer or a germanium layer. Before the dielectric layer filling the isolation groove is formed, the method may further include: oxidation treatment is performed on the first protective layer to convert the first protective layer into a first substrate isolation layer.

In addition, a process temperature used in the oxidation treatment ranges from 750° C. to 1000° C. When the oxidation treatment is used to enlarge the feature size of the bottom of the isolation groove, the first substrate isolation layer and the second substrate isolation layer formed by the oxidation treatment have good compactness and fewer defects, and the isolation effect of the subsequently formed isolation structure is better.

In addition, before the first protective layer is formed, the method may further include: a second protective layer is formed on the top of the semiconductor substrate, in which the first protective layer covers a top and a side wall of the second protective layer.

In addition, before the first protective layer is formed, the method may further include: a barrier layer is formed on the side wall of the isolation groove, in which a material of the barrier layer is different from a material of the first protective layer and a material of the semiconductor substrate. The barrier layer is formed to prevent the semiconductor substrate as the side wall of the isolation groove from being oxidized, and also prevent the semiconductor substrate as the side wall of the isolation groove from being etched during the manufacturing process.

In addition, a thickness of the formed barrier layer ranges from 30 angstroms to 70 angstroms.

In a direction perpendicular to the surface of the semiconductor substrate, a thickness of the top region isolation groove is less than a thickness of the bottom region isolation groove, and the thickness of the top region isolation groove is greater than ½ of the thickness of the bottom region isolation groove.

The embodiments of this application further provide a semiconductor structure, including: a semiconductor substrate, in which a plurality of isolation grooves distributed at intervals are provided in the semiconductor substrate, each of the isolation grooves includes a top region isolation groove and a bottom region isolation groove, and the top region isolation groove is at a higher position than the bottom region isolation groove; a top isolation structure configured to fill the top region isolation groove, in which the top isolation structure includes a first substrate isolation layer located on a side wall of the top region isolation groove and a dielectric layer filling the top region isolation groove; and a bottom isolation structure configured to fill the bottom region isolation groove, in which the bottom isolation structure includes a second substrate isolation layer located on a side wall of the bottom region isolation groove and a dielectric layer filling the bottom region isolation groove. In any direction parallel to the surface of the semiconductor substrate, the size of the bottom isolation structure is greater than the size of the bottom region isolation groove.

In addition, in a direction perpendicular to the surface of the semiconductor substrate, a height of the top isolation structure is less than a height of the bottom isolation structure, and the height of the top isolation structure is greater than ½ of the height of the bottom isolation structure.

In addition, the semiconductor structure may further include: a barrier layer. The barrier layer is located on the side wall of the isolation groove. The first substrate isolation layer is located on the side wall of the barrier layer in the top region isolation groove. A part of the second substrate isolation layer is located between the semiconductor substrate and the barrier layer, and a part of the second substrate isolation layer is located between the barrier layer and the dielectric layer.

In addition, a thickness of the barrier layer ranges from 30 angstroms to 70 angstroms.

Compared with related technologies, the first protective layer prevents the semiconductor substrate between the isolation grooves from being oxidized during the manufacturing process, thereby preventing the feature size of the active region between the isolation grooves from becoming smaller. Furthermore, the second substrate isolation layer partially occupies the original position of the semiconductor substrate, and the second substrate isolation layer partially occupies the position of the isolation groove, so that the feature size of the bottom of the isolation structure formed by filling is greater than the feature size of the formed bottom region isolation groove, so as to improve the isolation effect of the formed isolation structure.

DETAILED DESCRIPTION

At present, due to the introduction of the polysilicon thin layer compensation technology, an isolation groove is prone to generate a thicker silicon gasket at the bottom of a region with a high depth-to-width ratio during polysilicon deposition. The thicker silicon gasket at the bottom cannot be completely oxidized in the subsequent oxidation process, so that the isolation effect of the formed isolation structure is weakened, resulting in electrical abnormality of a semiconductor device.

In order to solve the above problem, an embodiment of this application provides a method of forming a semiconductor structure. The method includes the following operations. A semiconductor substrate is provided, in which a plurality of isolation grooves distributed at intervals are provided in the semiconductor substrate. Each of the isolation groove includes a top region isolation groove and a bottom region isolation groove. The top region isolation groove is at a higher position than the bottom region isolation groove. A first protective layer covering the side wall of the top region isolation groove and the top of the semiconductor substrate is formed. Oxidation treatment is performed on the bottom region isolation groove to oxidize a part of the semiconductor substrate close to the bottom region isolation groove to form a second substrate isolation layer. A dielectric layer filling the isolation groove is formed. The first protective layer and the dielectric layer higher than the top of the semiconductor substrate are etched to form an isolation structure.

In order to make the objectives, technical solutions and advantages of the embodiments of this application clearer, the embodiments of this application will be described in detail below with reference to the accompanying drawings. However, a person of ordinary skill in the art can understand that in the embodiments of this application, many technical details are proposed for readers to better understand this application. However, even without these technical details, the technical solutions claimed in this application can also be realized based on various changes and modifications to the following embodiments. The division of the following embodiments is for the convenience of description, and should not constitute any limitations on the specific implementation manners of this application. The embodiments can be combined with and referred to each other without contradiction.

FIG. 1 to FIG. 15 are schematic diagrams of cross-sectional structures corresponding to each of the steps in a method of forming a semiconductor structure provided by an embodiment of this application. The method of forming the semiconductor structure of this embodiment will be specifically described below.

Figure 1:
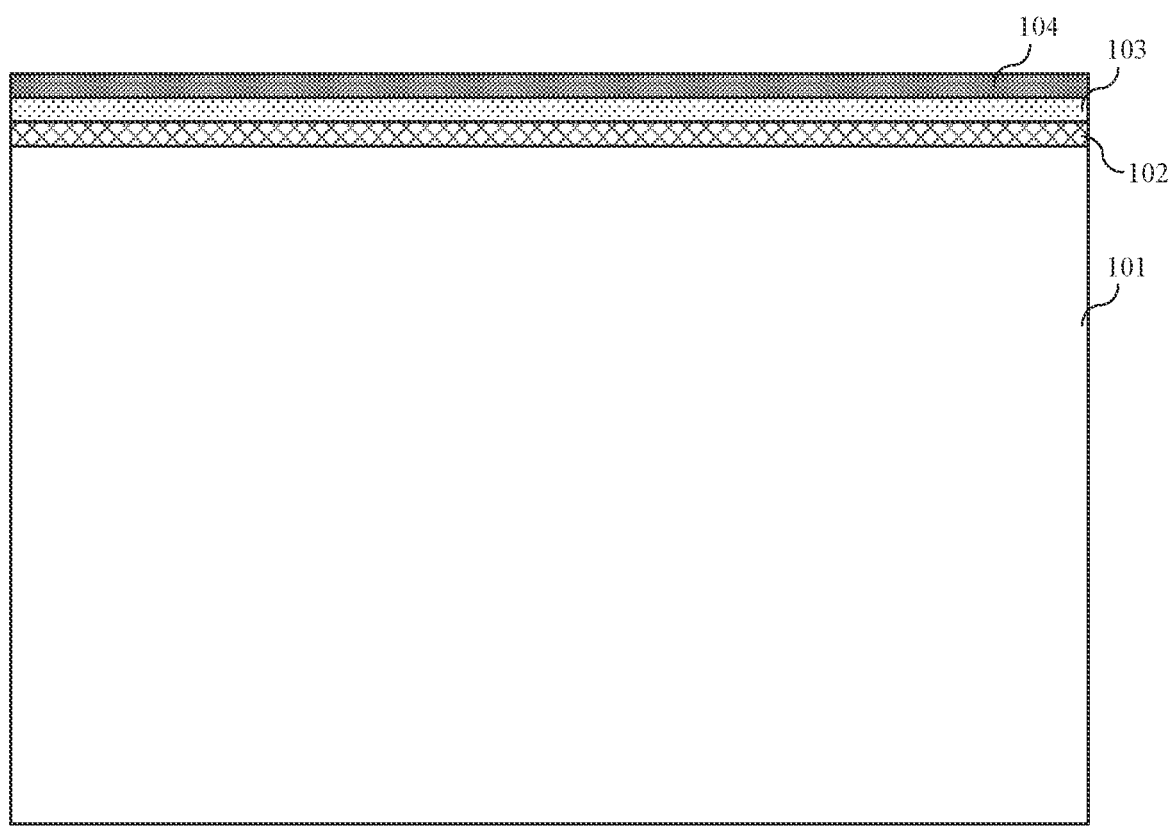
FIG. 1 to FIG. 15 are schematic diagrams of cross-sectional structures respectively corresponding to the steps in a method of forming a semiconductor structure provided by an embodiment of this application.
Figure 2:
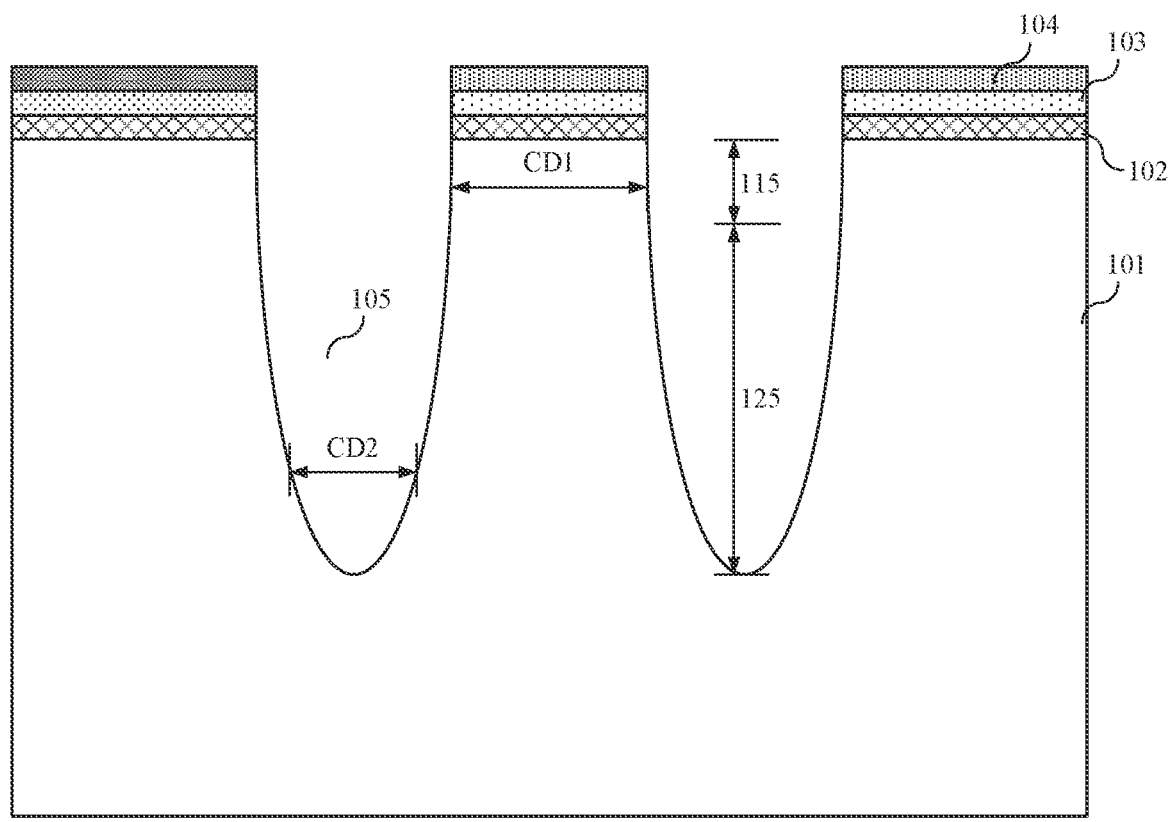
Figure 3:
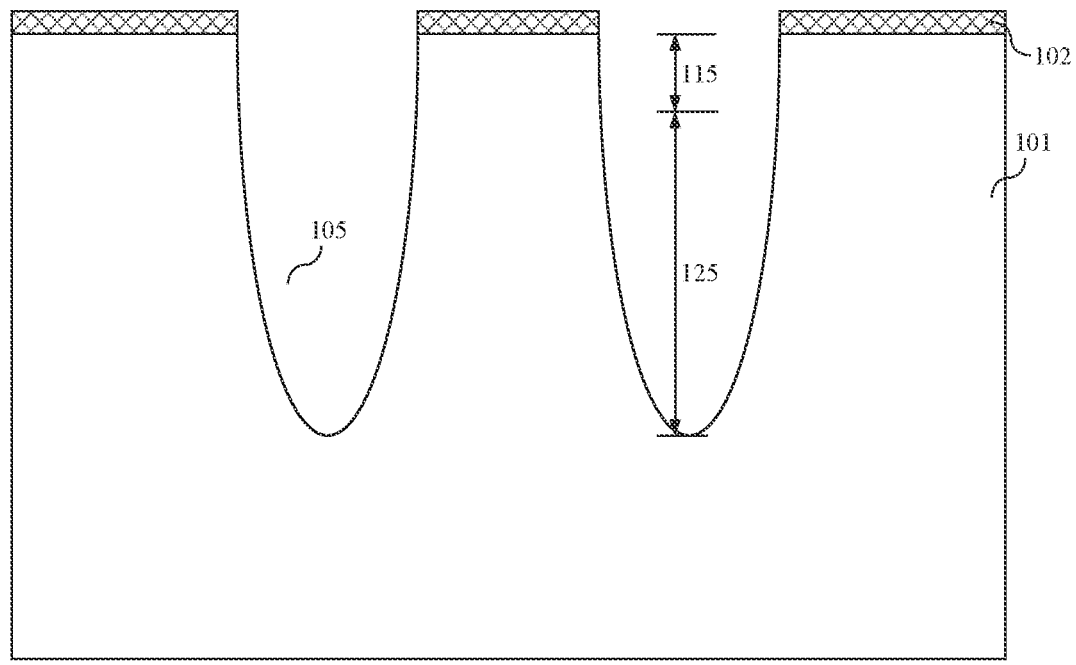

Referring to FIG. 1 to FIG. 3, a semiconductor substrate 101 is provided. A plurality of isolation grooves 105 distributed at intervals are provided in the semiconductor substrate 101. A second protective layer 102 is provided on the top of the semiconductor substrate 101 between the isolation grooves 105. Each of the isolation grooves 105 includes a top region isolation groove 115 and a bottom region isolation groove 125, and the top region isolation groove 115 is at a higher position than the bottom region isolation groove 125.

Specifically, referring to FIG. 1, a semiconductor substrate 101 is provided. A second protective layer 102, a mask layer 103 and a photoresist layer 104 are formed on the semiconductor substrate 101 in sequence.

In this embodiment, the second protective layer 102 is made of a silicon nitride material which is used as an insulating material and is not easily oxidized. The second protective layer 102 can be used to protect the semiconductor substrate 101 between the isolation grooves 105, and can also prevent the top of the semiconductor substrate 101 between the isolation grooves 105 from being oxidized in subsequent processes. In other embodiments, the second protective layer may also be made of insulating materials such as silicon oxide and silicon oxynitride.

It should be noted that in this embodiment, the method of forming the semiconductor structure includes a solution of forming a second protective layer. The second protective layer is configured to further prevent the top surface of the semiconductor substrate from being oxidized. The region covered by the first protective layer includes a contact surface between the second protective layer and the semiconductor substrate to prevent the contact surface between the semiconductor substrate and the second protective layer from being oxidized, thereby preventing generation of appearance defects. In other embodiments, the second protective layer may not be formed.

Referring to FIG. 2, the photoresist layer 104 is patterned. The mask layer 103, the second protective layer 102 and the semiconductor substrate 101 are etched to form a plurality of isolation grooves 105 distributed at intervals. The isolation groove 105 is configured to subsequently form an isolation structure. The feature size of the top of the semiconductor substrate 101 between the isolation grooves 105 is CD1. The feature size of the bottom region isolation groove 125 on a preset plane is CD2. The top of the etched semiconductor substrate 101 has the mask layer 103, and the top of the mask layer 103 has the patterned photoresist layer 104.

Referring to FIG. 3, the photoresist layer 104 and the mask layer 103 are removed in sequence.

Specifically, the photoresist layer 104 is removed by a first dry cleaning process. The first dry cleaning process uses mixed gases of ammonia, nitrogen and hydrogen. The mixed gas reacts with the photoresist layer 104 to generate a first cured product, and then, the first cured product is evaporated in a high-temperature evaporation manner, thereby completing the removal of the photoresist layer 104.

It should be noted that in this embodiment, in the process of the mixed gas of ammonia, nitrogen and hydrogen reacting with the photoresist layer 104 to generate the first cured product, since the mixed gas does not contain oxygen and the isolation groove 105 is prevented from being in contact with the air, the natural oxidation of the semiconductor substrate 101 on the side wall of the isolation groove 105 is prevented, while the photoresist layer 104 is removed. In other embodiments, the above first dry cleaning process may also be performed by only using the mixed gas for removing the photoresist layer.

After the photoresist layer 104 is removed, the mask layer 103 is removed by a first wet cleaning process. The first wet cleaning process uses a mixed solution of 49% HF and 1:1:60 APM ($H_2O_2$:$NH_4OH$:$H_2O$=1:1:60). The mixed solution and the mask layer 103 react chemically to remove the mask layer 103.

It should be noted that in this embodiment, in the process of removing the mask layer 103 by using the mixed solution of 49% HF and 1:1:60 APM to react with the mask layer 103, since the mixed solution contains $NH_4OH$, $OH^-$ will be generated by ionizing. Due to the negative charge repulsion effect of $OH^-$ and the oxidizing property of $H_2O_2$, particulate matters on the side wall of the isolation groove 105 can be removed. In other embodiments, the above first wet cleaning process may also be performed by only using the mixed solution for removing the mask layer.

Figure 4:
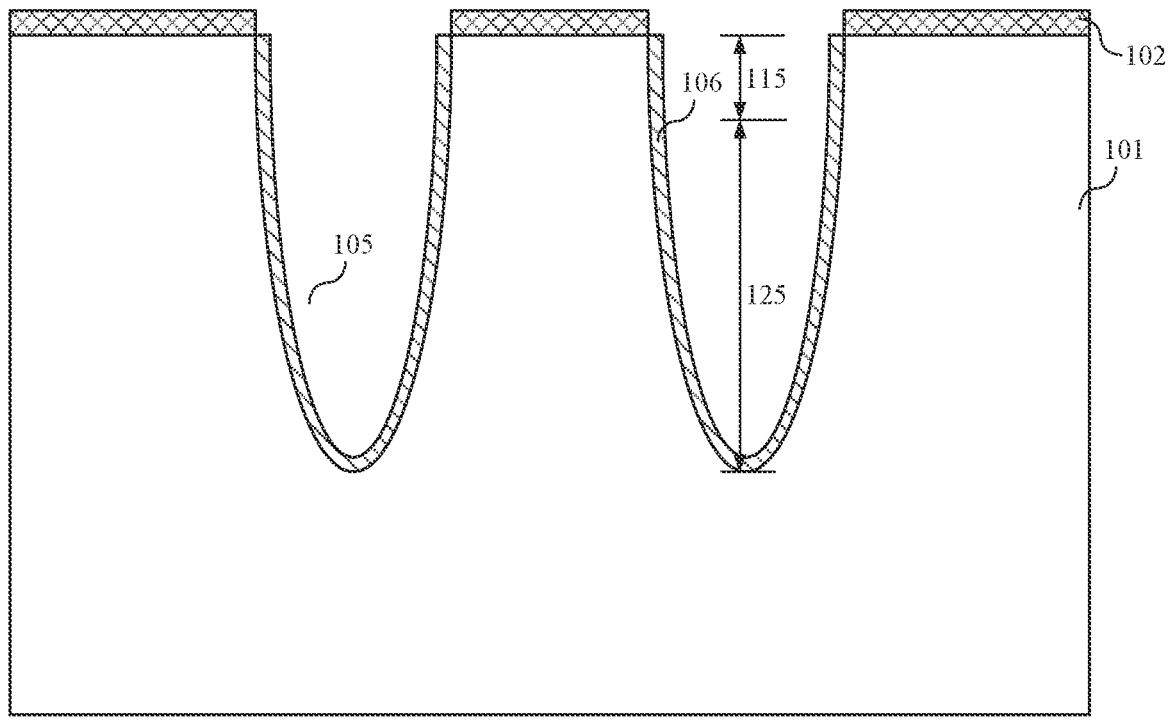

This embodiment further includes a forming method of a barrier layer. Referring to FIG. 4, a barrier layer 106 is formed on the side wall of the isolation groove 105. The material of the barrier layer 106 is different from the material of the subsequently formed first protective layer and the material of the semiconductor substrate 101.

Since the barrier layer 106 is formed in the isolation groove 105, in order to ensure the isolation effect of the subsequently formed isolation structure in the isolation groove 105, a material with a better insulating property should be used as the material of the barrier layer 106. That is, in this embodiment, the barrier layer 106 is made of a silicon oxide material. Specifically, in this embodiment, the thickness of the barrier layer 106 ranges from 30 angstroms to 70 angstroms, such as 35 angstroms, 40 angstroms, 45 angstroms, 50 angstroms, 55 angstroms, 60 angstroms or 65 angstroms.

Specifically, the forming method of the barrier layer 106 includes forming the barrier layer 106 on the side wall of the isolation groove 105 by means of Atomic Layer Deposition (ALD), Chemical Vapor Deposition (CVD) or epitaxial growth. By means of the ALD, CVD or epitaxial growth, the barrier layer 106 can grow faster to prevent the natural oxidation of the semiconductor substrate 101 as the side wall of the isolation groove 105.

It should be noted that in this embodiment, the forming method of the barrier layer 106 does not constitute a limitation on this embodiment. In other embodiments, the method of forming the semiconductor structure of this embodiment may also be performed by a method without forming the barrier layer.

Referring to FIG. 5 to FIG. 11, a first protective layer 117 covering the side wall of the top region isolation groove 115 is formed.

Figure 5:
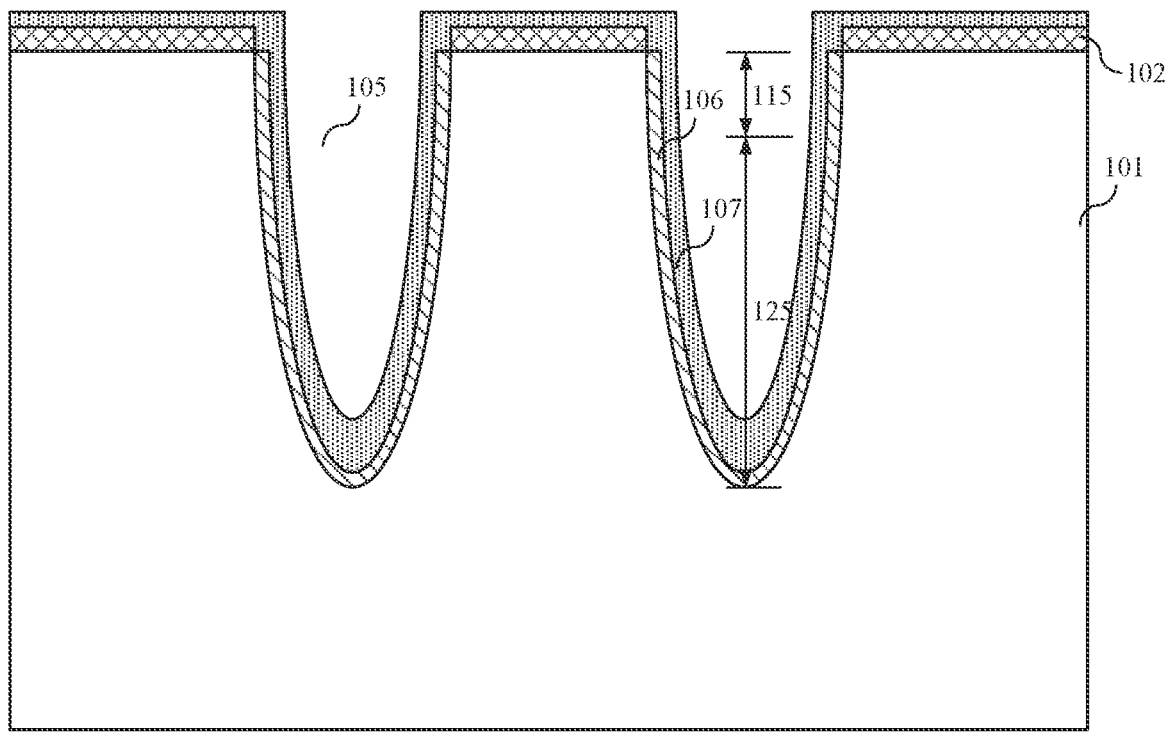

Specifically, referring to FIG. 5, a first protective film 107 covering the side wall of the isolation groove 105 is formed. The first protective film 107 is configured to subsequently form the first protective layer 117 to protect the side wall of the top region isolation groove 115.

Figure 6:
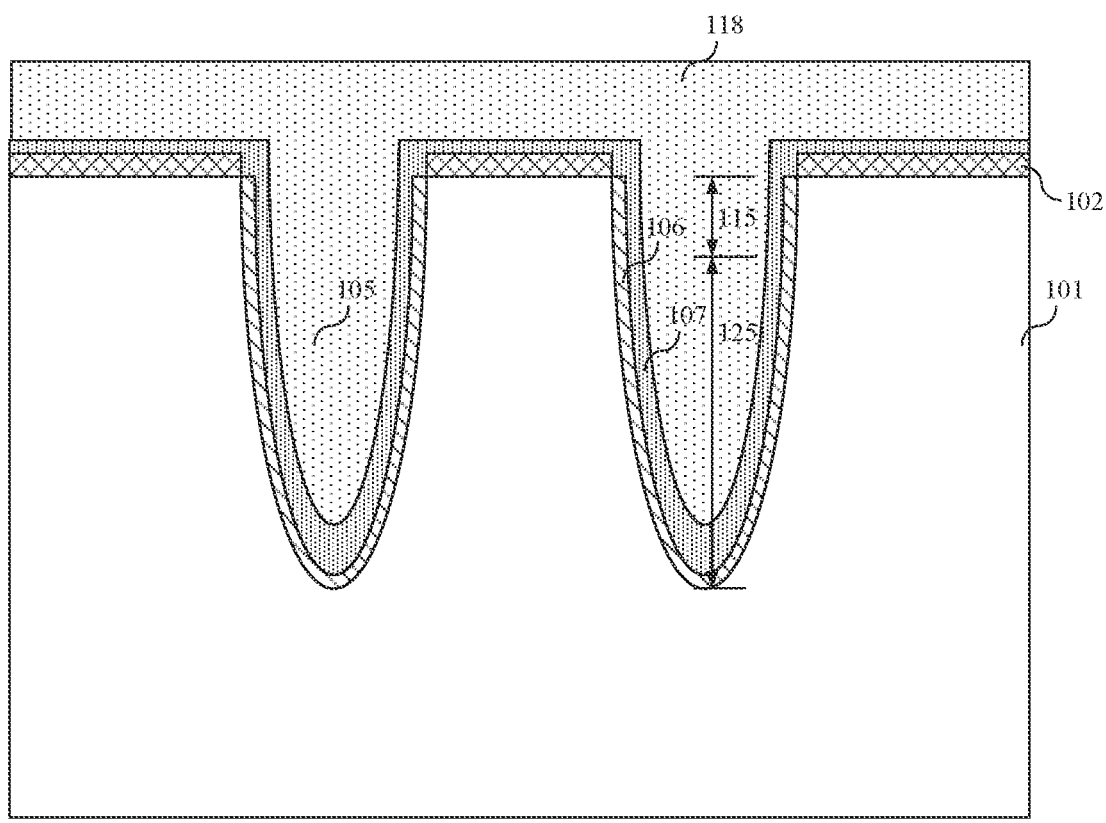
Figure 7:
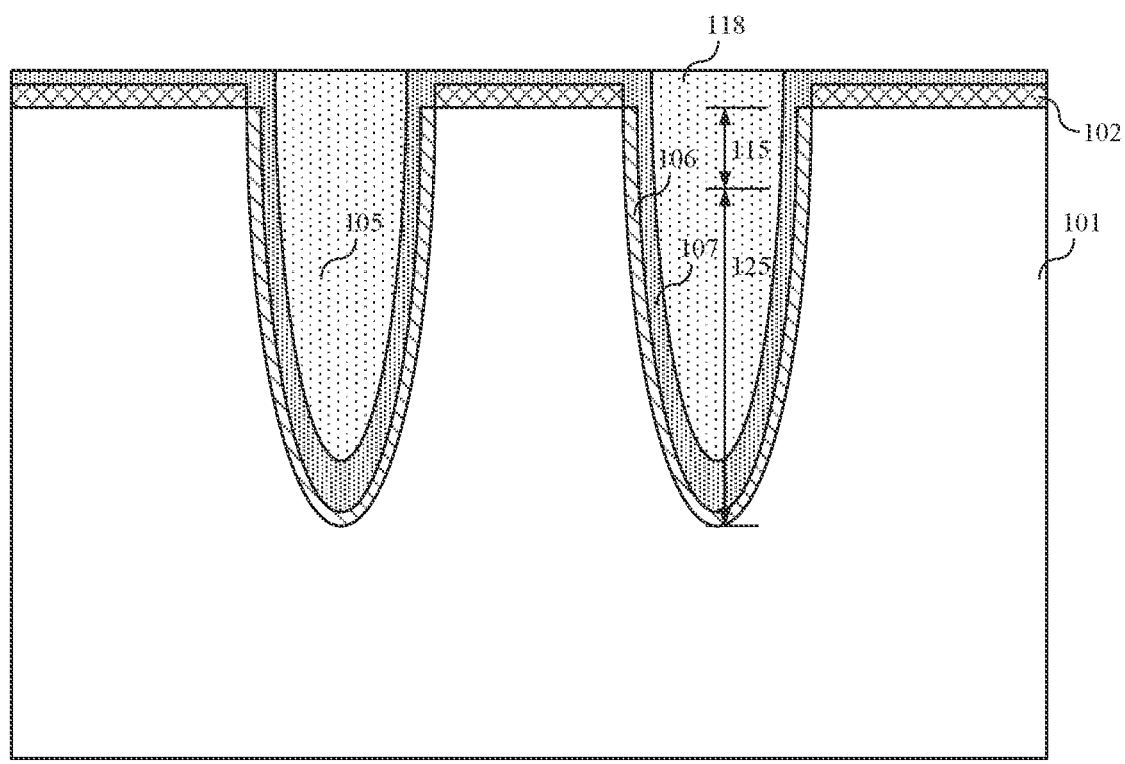
Figure 8:
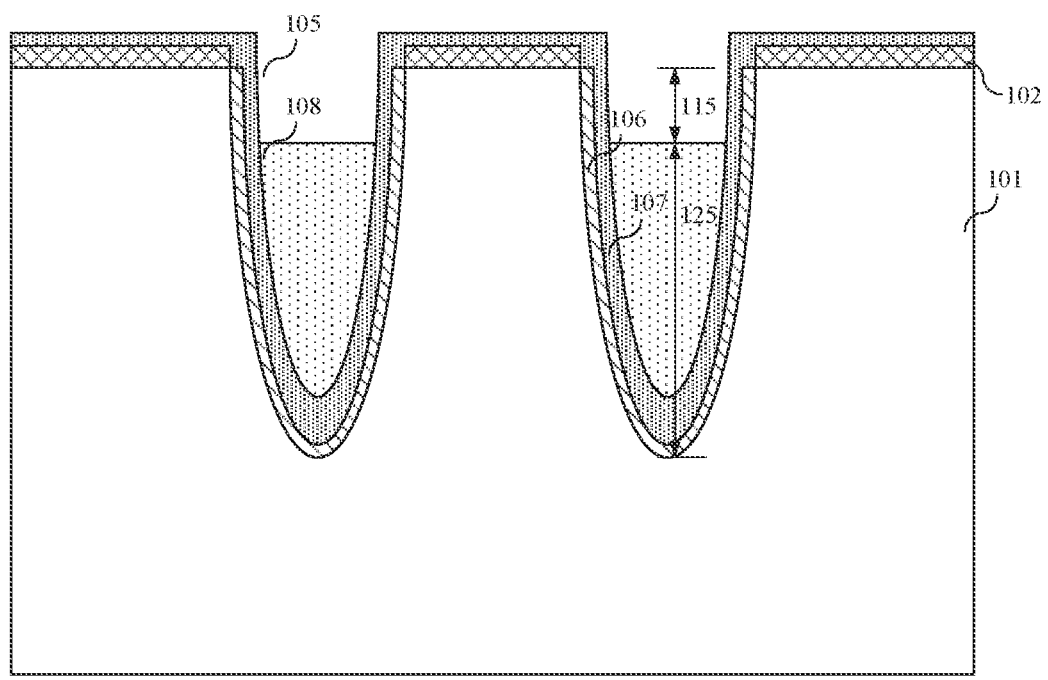

Referring to FIG. 6 to FIG. 8, a sacrificial layer 108 filling the bottom region isolation groove 125 is formed.

Specifically, referring to FIG. 6, a sacrificial film 118 filling the isolation groove 105 is formed. Further, the sacrificial film 118 covers the first protective film 107 above the semiconductor substrate 101.

Referring to FIG. 7, the sacrificial film 118 on the top of the first protective film 107 is removed by chemical mechanical polishing, so that the height of the remaining sacrificial film 118 is flush with the height of the first protective film 107.

Referring to FIG. 8, the remaining sacrificial film 118 is etched downward along the isolation groove 105 to form the sacrificial layer 108 filling the bottom region isolation groove 125, and the sacrificial layer 108 is etched to expose the first protective film 107 on the side wall of the top region isolation groove 115.

In an example, the material of the sacrificial layer 108 is the same as the material of the photoresist layer 104, and the sacrificial layer 108 may be removed by the first dry cleaning process subsequently. In another example, the material of the sacrificial layer 108 may be a carbon-containing material, and the sacrificial layer 108 may be removed by an incineration process subsequently.

In this embodiment, the first protective film 107 on the side wall and top surface of the second protective layer 102 is not removed, that is, the subsequently formed first protective layer 117 also covers the side wall and top surface of a part of the second protective layer 102. That is, the region covered by the first protective layer 117 includes a contact surface between the second protective layer 102 and the semiconductor substrate, which can prevent the "bird's beak" caused by oxidation of the contact surface between the second protective layer 102 and the semiconductor substrate 101 (the "bird's beak" means that since the semiconductor substrate 101 is oxidized, the generated oxide layer will partially grow inward and partially grow outward, and then the original semiconductor substrate 101 with a flat top surface becomes uneven, which causes the contact surface between the semiconductor substrate 101 and the second protective layer 102 to tilt and generate an angle similar to a "bird beak"). In an example, the first protective film on the side wall and top of the second protective layer may also be removed, and in this case, the formed first protective layer is only located on the side wall of the top region.

It should be noted that in this embodiment, the height difference between the formed sacrificial layer 108 and the top of the isolation groove 105 is about ⅓ to ½ of the depth of the isolation groove 105. That is, in a direction perpendicular to the semiconductor substrate 101, the height of the top region isolation groove 115 is less than the height of the bottom region isolation groove 125, and the height of the top region isolation groove 115 is greater than ½ of the height of the bottom region isolation groove 125.

Figure 9:
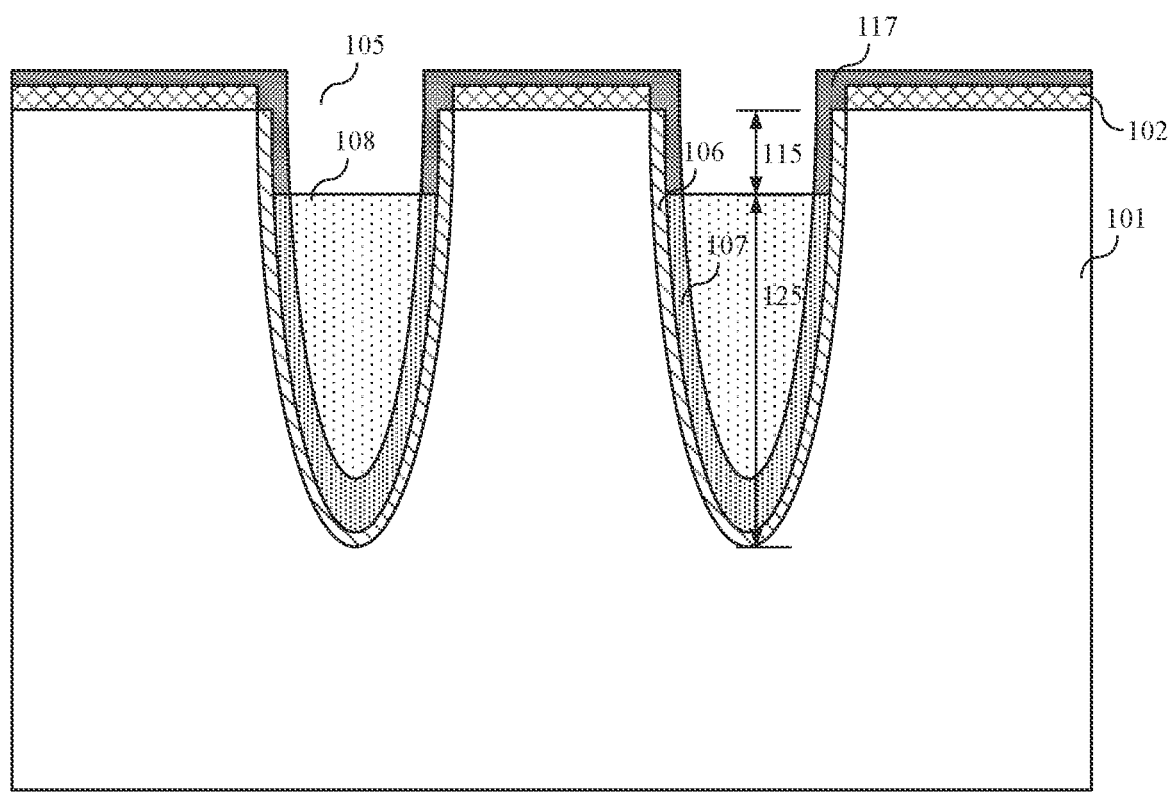

Referring to FIG. 9, the exposed first protective film 107 is treated to form the first protective layer 117.

The treatment includes ion implantation, such that the hardness of the first protective layer 117 is greater than that of the first protective film 107 and the etching rate is relatively low during subsequent etching (the etching rate of the first protective layer 117 is less than the etching rate of the first protective film 107). The first protective layer 117 and the first protective film 107 have a larger etching selection ratio, so that the first protective layer 117 is more difficult to be etched.

Specifically, the implanted ion at least includes one of phosphorus, arsenic, boron, boron fluoride or carbon. The ion implantation is performed in a tilted implantation manner, and a tilt angle ranges from 15° to 20°, such as 16°, 17°, 18° or 19°.

Figure 10:
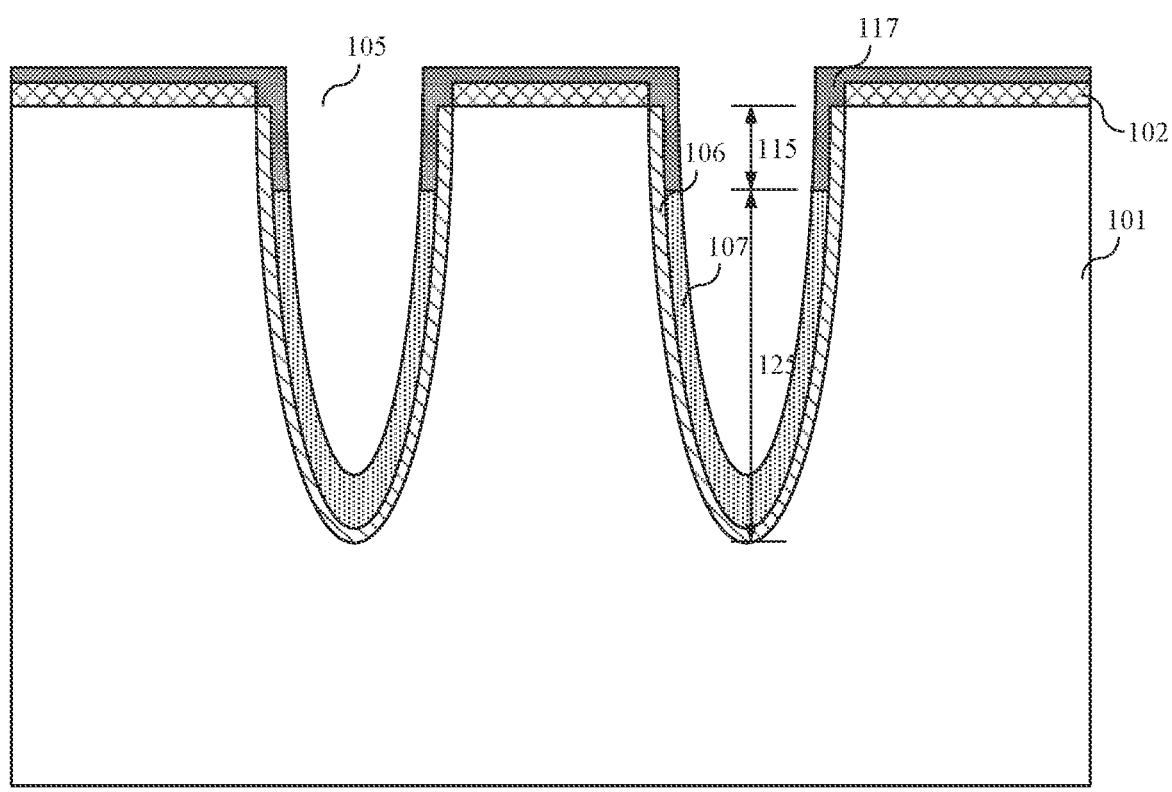
Figure 11:
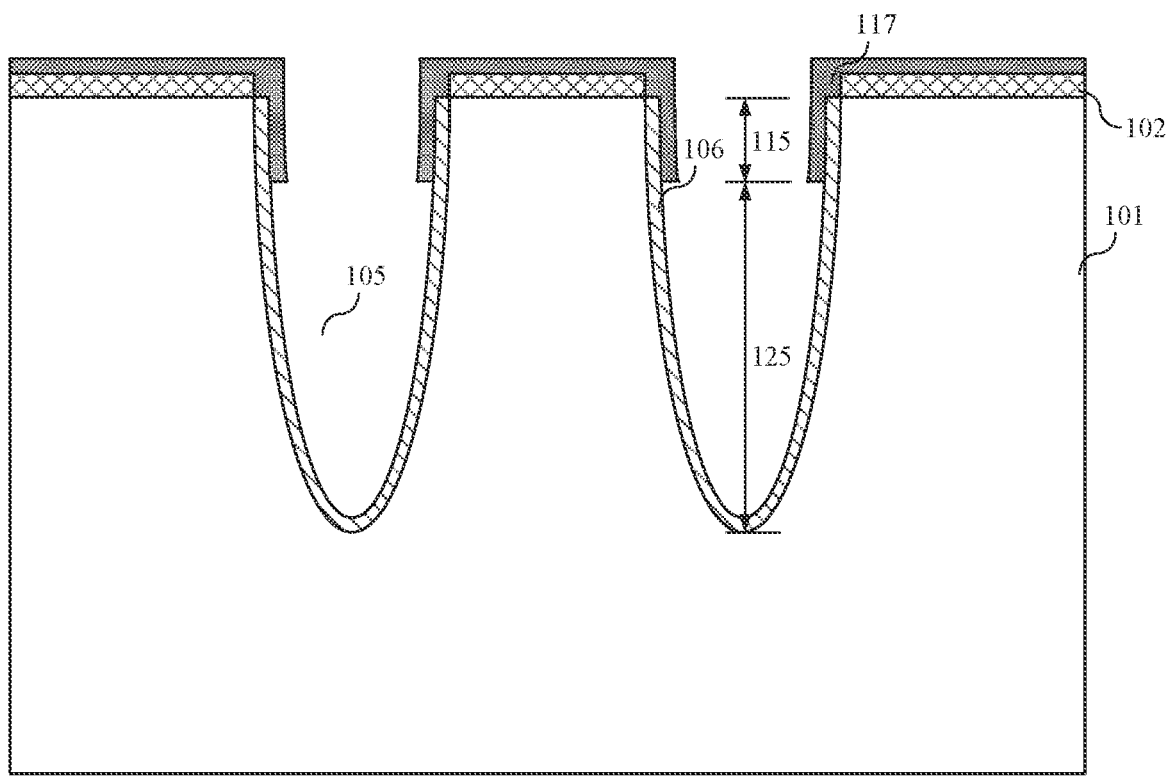

Referring to FIG. 10 and FIG. 11, the sacrificial layer 108 and the first protective film 107 which is not subjected to the ion implantation are removed, such that the first protective layer 117 is formed on the side wall of the top region isolation groove 115.

Specifically, referring to FIG. 10, the sacrificial layer 108 is removed.

In an example, the sacrificial layer 108 is removed by a second dry cleaning process. The mixed gas used in the second dry cleaning process at least includes oxygen, such that the sacrificial layer 108 can be removed as quickly as possible. Moreover, in this embodiment, since the barrier layer 106 is formed, the semiconductor substrate 101 as the side wall of the isolation groove 105 can be prevented from being oxidized.

Referring to FIG. 11, the first protective film 107 which is not subjected to the ion implantation is removed, such that the first protective layer 117 is formed on the side wall of the top region isolation groove 115.

The first protective layer 117 is configured to prevent the semiconductor substrate 101 between the isolation grooves 105 from being oxidized, thereby preventing the CD1 from being reduced, and ensuring that the area of the active region will not be reduced. That is, the subsequently formed first protective layer 117 mainly aims to prevent the side wall of the top region isolation groove 115 from being oxidized.

In an example, the first protective film 107 which is not subjected to the ion implantation is removed by a second wet cleaning process. The second wet cleaning process uses a material with an etching selection ratio for etching (the etching rate of the first protective film 107 which is not subjected to the ion implantation is greater than the etching rate of the first protective layer 117). In an example, the second wet cleaning process is performed by an NH$_4$OH or KOH solution to remove the first protective film 107 which is not subjected to the ion implantation.

In an example, the first protective film 107 includes a single crystal silicon layer, a polysilicon layer or a germanium layer, that is, the material of the first protective film 107 is single crystal silicon, polysilicon or germanium. In this way, through the coverage of the sacrificial layer 108 and the difference in the etching selection ratio caused by the ion implantation, the first protective film 107 which is not subjected to the ion implantation can be easily removed by etching. Furthermore, due to the material difference between the barrier layer 106 and the first protective film 107, an etching selection ratio is formed so as to prevent the semiconductor substrate 101 as the side wall of the isolation groove 105 from being etched.

Figure 12:
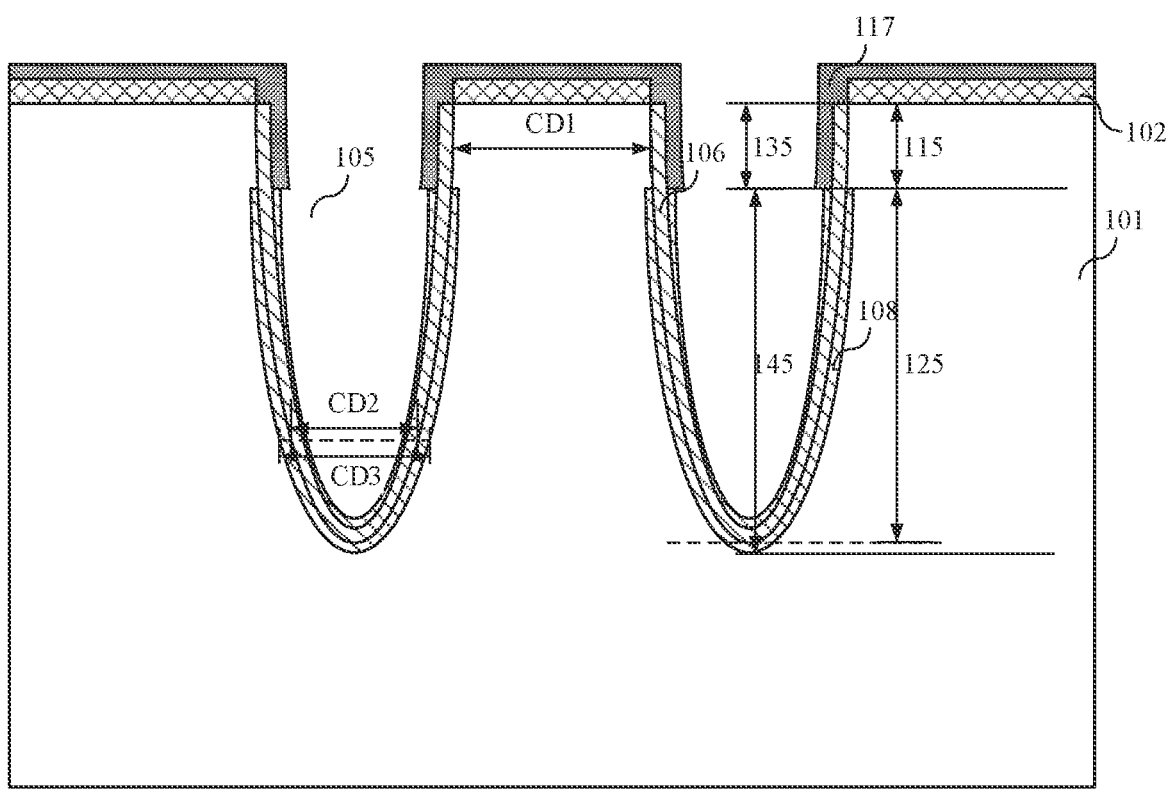
Figure 13:
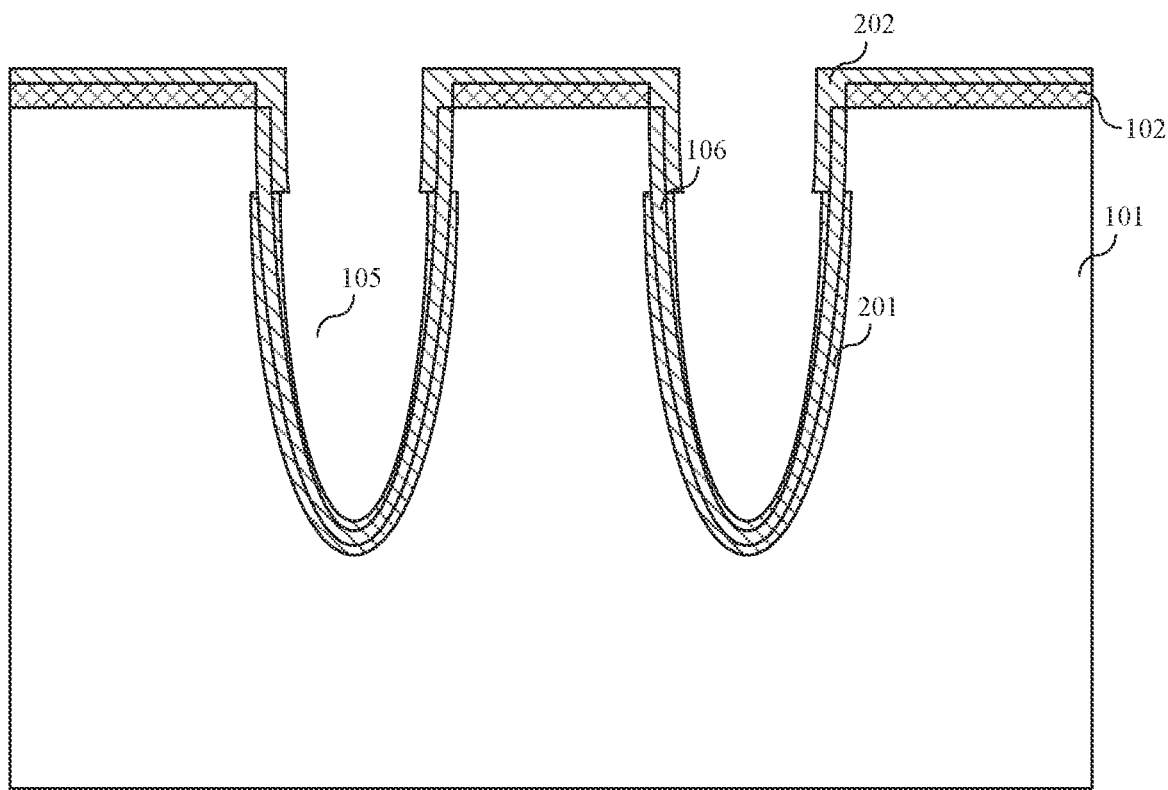

Referring to FIG. 12, oxidation treatment is performed on the bottom region isolation groove 125 to convert the semiconductor substrate 101 close to the bottom region isolation groove 125 into a second substrate isolation layer 201.

In this embodiment, a part of the second substrate isolation layer 201 formed by the oxidation treatment grows on the surface of the barrier layer 106, that is, a part of the second substrate isolation layer 201 is located between the semiconductor substrate 101 and the barrier layer 106, and a part of the second substrate isolation layer 201 is located on one side of the barrier layer 106 away from the semiconductor substrate 101.

The process temperature used in the oxidation treatment ranges from 750° C. to 1000° C., such as 800° C., 850° C., 900° C. or 950° C. The first substrate isolation layer 202 and the second substrate isolation layer 201 formed by the oxidation treatment have good compactness and fewer defects, and the isolation effect of the subsequently formed isolation structure is better.

It should be noted that in this embodiment, the material of the barrier layer 106 is the same as the material of the second substrate isolation layer 201. Moreover, in this embodiment, referring to FIG. 13, it is also necessary to perform oxidation treatment on the first protective layer 117 to convert the first protective layer 117 into the first substrate isolation layer 202. It should be noted that the first substrate isolation layer 202 and the second substrate isolation layer 201 are simultaneously formed by one-step oxidation treatment. The first protective layer 117 is converted into the first substrate isolation layer 202 to ensure that the barrier layer 106, the first substrate isolation layer 202, the second substrate isolation layer 201 in the isolation groove 105 and the subsequently formed dielectric layer are all made of the same material, so that the uniformity of isolation materials is ensured, and the isolation effect is better. Moreover, the base material for the ion implantation is single crystal silicon, polysilicon or germanium which is easier to be oxidized to generate the first substrate isolation layer 202.

Figure 14:
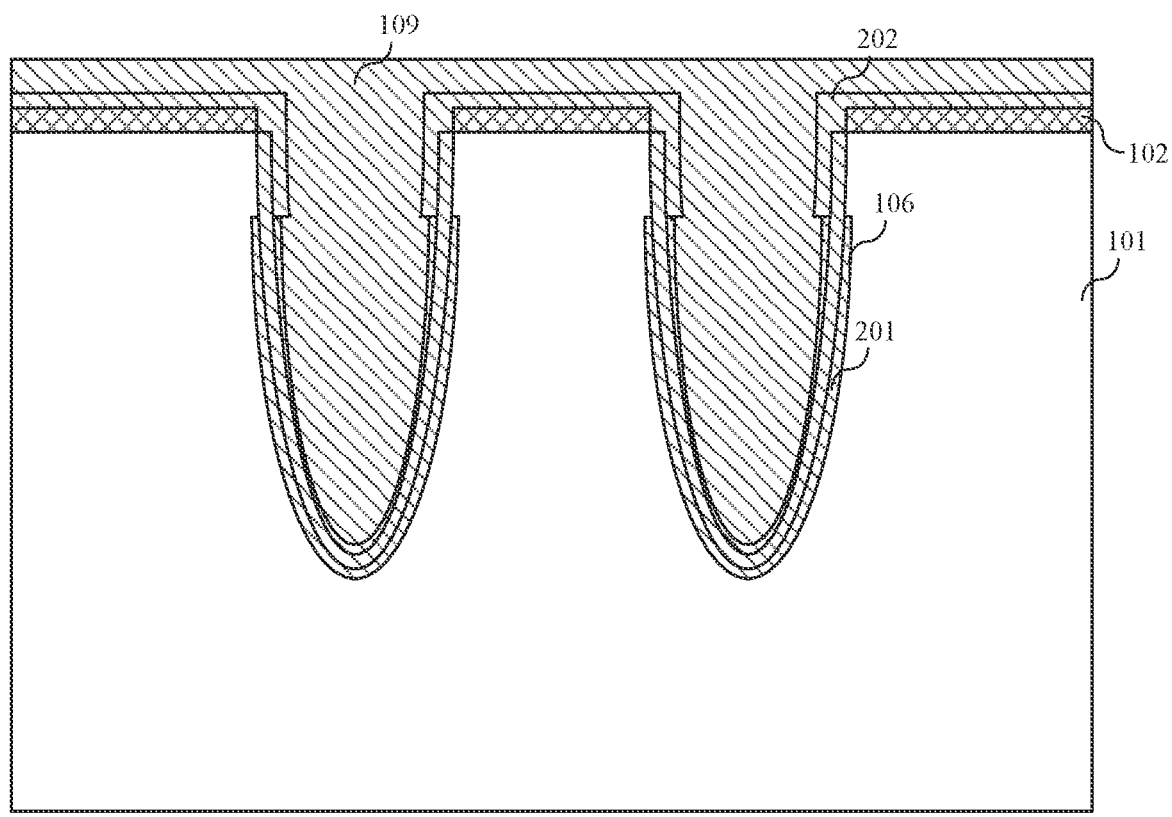

Referring to FIG. 14, a dielectric layer 109 filling the isolation groove 105 is formed.

Figure 15:
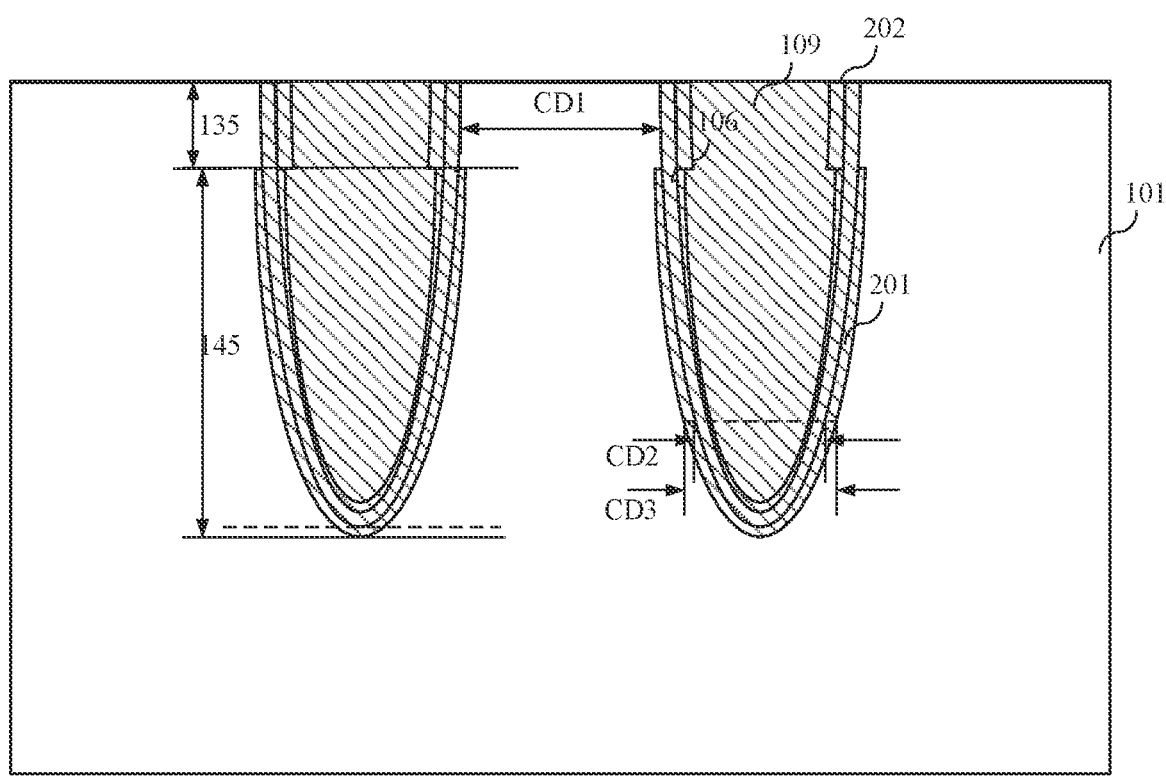

Referring to FIG. 15, the dielectric layer 109, the first substrate isolation layer 202 and the second protective layer 102 higher than the top of the semiconductor substrate 101 are etched to form an isolation structure. The isolation structure includes a top isolation structure 135 located in the top region isolation groove 115 and a bottom isolation structure 145 located in the bottom region isolation groove 125.

Specifically, the isolation groove 105 is filled by an ALD process or a CVD process to form the dielectric layer 109. The ALD process or the CVD process has the characteristics of low deposition rate, high compactness and good step coverage of a layer formed by deposition, etc. Therefore, the dielectric layer 109 can completely fill the remaining isolation groove 105 to form a compact insulation structure. In this embodiment, the material of the dielectric layer 109 and the material of the first substrate isolation layer 202 are the same and both are silicon oxide, so as to ensure that the isolation materials in the isolation groove 105 are all the same material and have continuity.

Subsequently, the dielectric layer 109, the first substrate isolation layer 202 and the second protective layer 102 higher than the surface of the semiconductor substrate 101 are etched away to form the isolation structure. In this case, the feature size of the top of the semiconductor substrate 101 between the isolation structures will not change, that is, the feature size CD1 of the active region will not change, so as to ensure that a sufficient area is reserved for subsequent capacitor contact or bit line contact, so that the contact performance of a semiconductor device becomes better. The feature size of the formed isolation structure becomes larger, that is, the feature size of the bottom of the isolation structure formed in the above manner on the preset plane is greater than the feature size of the bottom region isolation groove (that is, CD3 is greater than CD2), thereby improving the isolation effect of the isolation structure.

Compared with related technologies, the first protective layer is formed on the side wall of the top region isolation groove to prevent the semiconductor substrate between the isolation grooves from being oxidized during the manufacturing process of the isolation groove, thereby preventing the feature size of the active region between the isolation grooves from becoming smaller. Then, the oxidation treatment is performed on the bottom region isolation groove to convert the semiconductor substrate close to the bottom region isolation groove into a second substrate isolation layer. In the process of converting the semiconductor substrate into the second substrate isolation layer, a part of the second substrate isolation layer grows inward, and a part of the second substrate isolation layer grows outward, so that in a direction parallel to the top surface of the semiconductor substrate, the feature size of the bottom of the isolation structure formed by subsequent filling is greater than the feature size of the formed bottom region isolation groove, so as to improve the isolation effect of the formed isolation structure.

The division of the above steps is only for clarity of description. When implemented, the steps can be combined into one step or some steps can be split into multiple steps. As long as they include the same logical relationship, they are all within the protection scope of this patent. Adding insignificant modifications or introducing insignificant designs to the process without changing the key design of the process are all within the protection scope of this patent.

Another embodiment of this application relates to a semiconductor structure.

Referring to FIG. 12 to FIG. 15, the semiconductor structure provided by this embodiment will be described in detail below with reference to the drawings, and the parts that are the same as or corresponding to the above embodiments will not be described in detail below.

A semiconductor structure includes a semiconductor substrate 101, a top isolation structure 135 and a bottom isolation structure 145. A plurality of isolation grooves 105 distributed at intervals are provided in the semiconductor substrate 101. Each of the isolation grooves 105 includes a top region isolation groove 115 and a bottom region isolation groove 125. The top region isolation groove 115 is at a higher position than the bottom region isolation groove 125. The top isolation structure 135 is configured to fill the top region isolation groove 115. The top isolation structure 135 includes a first substrate isolation layer 202 located on the side wall of the top region isolation groove 115 and a dielectric layer 109 filling the top region isolation groove 115. The bottom isolation structure 145 is configured to fill the bottom region isolation groove 125. The bottom isolation structure 145 includes a second substrate isolation layer 201 located on the side wall of the bottom region isolation groove 125 and a dielectric layer 109 filling the bottom region isolation groove. In any directions parallel to the surface of the semiconductor substrate 101, the size of the bottom isolation structure 145 is greater than the size of the bottom region isolation groove 125.

It should be noted that in this embodiment, in a direction perpendicular to the surface of the semiconductor substrate 101, the size of the bottom isolation structure 145 is greater than the size of the bottom region isolation groove 125.

The isolation groove 105 is configured to subsequently form an isolation structure. The feature size of the top of the semiconductor substrate 101 between the isolation grooves 105 is CD1, and the feature size of the bottom region isolation groove 125 on a preset plane is CD2.

In this embodiment, in a direction perpendicular to the semiconductor substrate 101, the height of the top region isolation groove 115 is less than the height of the bottom region isolation groove 125, and the height of the top region isolation groove 115 is greater than ½ of the height of the bottom region isolation groove 125. That is, the height of the top isolation structure 135 is less than the height of the bottom isolation structure 145, and the height of the top isolation structure 135 is greater than ½ of the height of the bottom isolation structure 145.

In this embodiment, the semiconductor structure further includes: a barrier layer 106 located on the side wall of the isolation groove 105. In this case, the first substrate isolation layer 202 is located on the side wall of the barrier layer 106 of the top region isolation groove 115, and the barrier layer 106 is located between the semiconductor substrate 101 and the first substrate isolation layer 202. The material of the barrier layer 106 is different from the material of the semiconductor substrate 101 for the following reasons. The barrier layer 106 is formed to prevent the semiconductor substrate 101 as the side wall of the isolation groove 105 from being oxidized. Due to the material difference, an etching selection ratio is formed so as to prevent the semiconductor substrate 101 as the side wall of the isolation groove 105 from being etched during the manufacturing process.

In this embodiment, the top isolation structure 135 is configured to fill the top region isolation groove 115. The top isolation structure 135 includes a first substrate isolation layer 202 located on the side wall of the top region isolation groove 115 and a dielectric layer 109 filling the top region isolation groove 115. The bottom isolation structure 145 is configured to fill the bottom region isolation groove 125. The bottom isolation structure 145 includes a second substrate isolation layer 201 located on the side wall of the bottom region isolation groove 125 and a dielectric layer 109 filling the bottom region isolation groove.

Specifically, the barrier layer 106 is made of a silicon oxide material. Specifically, in this embodiment, the thickness of the barrier layer 106 ranges from 30 angstroms to 70 angstroms, such as 35 angstroms, 40 angstroms, 45 angstroms, 50 angstroms, 55 angstroms, 60 angstroms or 65 angstroms.

The second substrate isolation layer 201 is formed by converting the semiconductor substrate 101, and partially occupies the position of the original semiconductor substrate 101 and partially occupies the position of the original isolation groove 105. Since the second substrate isolation layer 201 partially occupies the position of the semiconductor substrate 101, the feature size of the bottom of the formed isolation structure is greater than the feature size of the bottom of the isolation groove 105. That is, in any directions parallel to the surface of the semiconductor substrate 101, the size of the bottom isolation structure 145 is greater than the size of the bottom region isolation groove, and in a direction perpendicular to the surface of the semiconductor substrate 101, the size of the bottom isolation structure 145 is greater than the size of the bottom region isolation groove 125.

In order to ensure the sameness of the material of the dielectric layer 109 and the material of the second substrate isolation layer 201, in this embodiment, the material of the dielectric layer 109 and the material of the second substrate isolation layer 201 are both silicon oxide, so as to ensure that the isolation materials in the isolation groove 105 are all the same material and have continuity.

Compared with related technologies, the first protective layer prevents the semiconductor substrate between the isolation grooves from being oxidized during the manufacturing process of the isolation groove, thereby preventing the feature size of the active region between the isolation grooves from becoming smaller. Furthermore, a part of the second substrate isolation layer occupies the original position of the semiconductor substrate, and a part of the second substrate isolation layer occupies the position of the isolation groove, so that the feature size of the bottom of the isolation structure formed by filling is greater than the feature size of the formed bottom region isolation groove, so as to improve the isolation effect of the formed isolation structure.

Since the above embodiments and this embodiment correspond to each other, this embodiment can be implemented in cooperation with the above embodiments. The related technical details mentioned in the above embodiments are still valid in this embodiment, and the technical effects that can be achieved in the above embodiments can also be achieved in this embodiment. In order to reduce repetition, the details are not described here. Correspondingly, the related technical details mentioned in this embodiment can also be applied to the above embodiments.

A person of ordinary skill in the art can understand that the above embodiments are specific embodiments for implementing this application. In practical applications, various changes can be made in form and details without departing from the spirit and scope of this application.

The invention claimed is:

1. A method of forming a semiconductor structure, comprising:
providing a semiconductor substrate, wherein a plurality of isolation grooves distributed at intervals are provided in the semiconductor substrate, each of the isolation grooves comprises a top region isolation groove and a bottom region isolation groove, and the top region isolation groove is at a higher position than the bottom region isolation groove;
forming a first protective layer covering a side wall of the top region isolation groove and a top of the semiconductor substrate;
performing oxidation treatment on the bottom region isolation groove to oxidize a part of the semiconductor substrate close to the bottom region isolation groove to form a second substrate isolation layer; and
forming a dielectric layer filling each of the isolation grooves, and etching the first protective layer and the dielectric layer higher than the top of the semiconductor substrate to form an isolation structure,
wherein the forming the first protective layer covering the side wall of the top region isolation groove and the top of the semiconductor substrate comprises:
forming a first protective film covering the top of the semiconductor substrate and a side wall of each of the isolation grooves;
forming a sacrificial layer filling the bottom region isolation groove;
treating the first protective film on the top of the semiconductor substrate and the side wall of the top region isolation groove to form the first protective layer; and
removing the sacrificial layer and the first protective film which is not subjected to the treating, wherein an etching rate of the first protective layer is less than an etching rate of the first protective film.

2. The method of forming the semiconductor structure of claim 1, wherein the forming the sacrificial layer filling the bottom region isolation groove comprises:
forming a sacrificial film filling each of the isolation grooves, wherein the sacrificial film further covers a top surface of the semiconductor substrate;
removing the sacrificial film higher than a top surface of the first protective film; and
removing the sacrificial film in the top region isolation groove to form the sacrificial layer.

3. The method of forming the semiconductor structure of claim 1, wherein the treating comprises ion implantation, and an implanted ion at least comprises one of phosphorus, arsenic, boron, boron fluoride or carbon.

4. The method of forming the semiconductor structure of claim 3, wherein the ion implantation is performed in a tilted implantation manner, and a tilt angle ranges from 15° to 20°.

5. The method of forming the semiconductor structure of claim 1, wherein the first protective film comprises a single crystal silicon layer, a polysilicon layer or a germanium layer;
 before the forming the dielectric layer filling each of the isolation grooves, the method further comprises:
  performing the oxidation treatment on the first protective layer to convert the first protective layer into a first substrate isolation layer.

6. The method of forming the semiconductor structure of claim 5, wherein a process temperature used in the oxidation treatment ranges from 750° C. to 1000° C.

7. The method of forming the semiconductor structure of claim 1, wherein before the forming the first protective layer, the method further comprises:
 forming a second protective layer on the top of the semiconductor substrate, wherein the first protective layer covers a top and a side wall of the second protective layer.

8. The method of forming the semiconductor structure of claim 1, wherein before the forming the first protective layer, the method further comprises:
 forming a barrier layer on the side wall of each of the isolation grooves, wherein a material of the barrier layer is different from a material of the first protective layer and a material of the semiconductor substrate.

9. The method of forming the semiconductor structure of claim 8, wherein a thickness of the barrier layer formed ranges from 30 angstroms to 70 angstroms.

10. The method of forming the semiconductor structure of claim 1, wherein in a direction perpendicular to a top surface of the semiconductor substrate, a thickness of the top region isolation groove is less than a thickness of the bottom region isolation groove, and the thickness of the top region isolation groove is greater than ½ of the thickness of the bottom region isolation groove.

\* \* \* \* \*